United States Patent
Wagner

(10) Patent No.: US 7,115,983 B2
(45) Date of Patent: Oct. 3, 2006

(54) MULTILAYER, THIN-FILM ELECTRONIC DEVICES

(75) Inventor: Sigurd Wagner, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 10/945,610

(22) Filed: Sep. 21, 2004

(65) Prior Publication Data

US 2005/0042796 A1 Feb. 24, 2005

Related U.S. Application Data

(62) Division of application No. 09/647,193, filed as application No. PCT/US99/06453 on Mar. 26, 1999, now Pat. No. 6,893,896.

(60) Provisional application No. 60/079,746, filed on Mar. 27, 1998.

(51) Int. Cl.
H01L 23/02 (2006.01)

(52) U.S. Cl. ............... 257/686; 257/723; 257/724; 257/E21.503

(58) Field of Classification Search ........... 438/107, 438/109, 119, 128, 149, 455, 458, 610, FOR. 369, 438/FOR. 426; 257/72, 686, 723, 724, E21.503
See application file for complete search history.

(56) References Cited

U.S. PATENT DOCUMENTS

| | | | |
|---|---|---|---|
| 4,735,847 A * | 4/1988 | Fujiwara et al. | 428/209 |
| 4,796,975 A | 1/1989 | Lukas et al. | 350/320 |
| 4,810,637 A | 3/1989 | Szydlo et al. | 437/15 |
| 5,049,527 A | 9/1991 | Merrick et al. | 437/220 |
| 5,249,245 A | 9/1993 | Lebby et al. | 385/89 |
| 5,302,456 A * | 4/1994 | Matsui | 428/407 |
| 5,409,798 A | 4/1995 | Kondo et al. | 430/203 |
| 5,471,552 A | 11/1995 | Wuu et al. | 385/49 |
| 5,496,743 A | 3/1996 | Luryi | 437/31 |
| 5,698,452 A | 12/1997 | Goossen | 437/2 |
| 5,699,073 A | 12/1997 | Lebby et al. | 345/82 |
| 5,712,695 A * | 1/1998 | Tanaka et al. | 349/79 |
| 5,944,537 A | 8/1999 | Smith et al. | 439/81 |
| 6,020,220 A | 2/2000 | Gilleo et al. | 438/119 |
| 6,025,857 A | 2/2000 | Obata et al. | 347/120 |
| 6,060,332 A | 5/2000 | Martin | 438/25 |
| 6,061,246 A * | 5/2000 | Oh et al. | 361/749 |
| 6,063,647 A | 5/2000 | Chen et al. | 438/108 |
| 6,121,070 A | 9/2000 | Akram | 438/108 |
| 6,133,637 A * | 10/2000 | Hikita et al. | 257/777 |

(Continued)

FOREIGN PATENT DOCUMENTS

JP 10335830 A 12/1998

OTHER PUBLICATIONS

Gleskova, et al., "Photoresist-Free Fabrication Process for a:Si:H TFTs," 17th International Conference Amorphous and Microcryst. Semiconductors, Budapest, Aug. 25-29, 1997.

(Continued)

Primary Examiner—Michelle Estrada
(74) Attorney, Agent, or Firm—McCarter & English, LLP

(57) ABSTRACT

Multilayer thin-film electronics are manufactured at high speed, even while the various component functions are manufactured separately under conditions tailored to optimize component performance and yield. Each function or group of functions is fabricated on a separate flexible substrate. These flexible substrates are bonded to each other using adhesive films that are anisotropic electrical conductors or optical light guides. The bonding is performed by laminating the flexible substrates to each other in a continuous process, using the anisotropic conductor as the bonding layer.

30 Claims, 1 Drawing Sheet

U.S. PATENT DOCUMENTS

| | | | |
|---|---|---|---|
| 6,137,162 A | 10/2000 | Park et al. | 257/685 |
| 6,175,157 B1* | 1/2001 | Morifuji | 257/777 |
| 6,380,597 B1 | 4/2002 | Gudesen et al. | 257/390 |
| 6,893,896 B1 | 5/2005 | Wagner | 438/107 |
| 6,951,684 B1* | 10/2005 | Cobbley et al. | 428/323 |

OTHER PUBLICATIONS

Hong, et al., "Direct Writing and Lift-Off Patterning of Copper Lines at 200C Maximum Process Temperature," Materials Research Society Symposium Proceedings, vol. 471, pp. 35-40 (1997).

Ma, et al., "Organic Light-Emitting Diode/Thin Film Transistor Integration for Foldable Displays," pp. L-78-L-81, 1997.

Ma, et al., "Thin Film Transistors for Foldable Displays," IEEE, 1997.

Theiss, et al., "Flexible, Lightweight Steel-Foil Substrates for a-Si:H Thin-Film Transistors," Mat. Res. Soc. Symp. Proc. vol. 471, pp. 21-27, 1997.

Wu, et al., "Integration of Oraganic LED's and Amorphous Si TFT's onto Flexible and Lighweight Metal Foil Substrates," IEEE Electron Device Letters, vol. 18, No. 12, pp. 609-612, Dec. 1997.

Wu, et al., "Integration of Organic LED's and Amorphous Si TFT's onto Unbreakable Metal Foil Substrates," IEDM 96, pp. 957-959.

Wu, et al., "Organic LEDs Integrated with a-Si TFTs on Lightweight Metal Substrates," SID 97 Digest, pp. 67-70, 1997.

* cited by examiner

MULTILAYER, THIN-FILM ELECTRONIC DEVICES

RELATED APPLICATIONS

This is a divisional application of U.S. patent application Ser. No. 09/647,193 filed Jul. 3, 2001, now U.S. Pat. No. 6,893,896, which is a U.S. National Phase Application under 35 U.S.C. § 371 of PCT Application No. PCT/US99/06453 filed Mar. 26, 1999, and claims the benefit of U.S. Provisional Application Ser. No. 60/079,746 filed Mar. 27, 1998, the entire disclosures of which are expressly incorporated herein by reference.

BACKGROUND OF THE INVENTION

1. Field of the Invention

This invention relates to large-area electronics and to methods for manufacturing thin film electronics continuously on separate carrier substrate foils, and then to combining these foils using anisotropic electrical conductors or light guides.

2. Related Art

In the field of thin film electronics where two or more layers of active circuits are employed, many technologies exist for connection of separate planes of passive circuits. One of these technologies is multilevel metallization on top of integrated silicon circuits, for which several levels of metal lines are built up by alternating between the fabrication of metal patterns, the deposition of insulators, the opening of vertical connections, followed by the fabrication of the next level of metal pattern, etc. Another of these technologies is multilevel printed wire boards (PWBs), for which passive metal connections are deposited on epoxy-based or ceramic boards that are fabricated with openings to make vertical connections. Individual boards are bonded to each other to form multilevel PWBs by bonding techniques that depend on the material of the board. These techniques are used industrially.

However, there are drawbacks associated with these existing techniques.

OBJECTS AND SUMMARY OF THE INVENTION

It is an object of this invention to provide a method of manufacturing macroelectronic circuits.

It is a further object of this invention to provide a method of manufacturing macroelectronic circuits which results in low cost and high yield.

It is yet another object of this invention to provide a method for manufacturing electronic circuits in a continuous process.

It is still a further object of the invention to provide a method of manufacturing electronic circuits where thin film electronics are manufactured continuously on separate carrier substrate foils.

It is another object of the invention to provide a method of combining the separately manufactured foils.

It is a still further object of the invention to combine separately manufactured foils using adhesives and anisotropic electrical conductors or light guides.

The present invention maintains high-speed manufacturing while the various component functions are manufactured separately under conditions tailored to optimize component performance and yield. The method involves the production of each function or group of functions on a separate flexible substrate, and bonding these flexible substrates to each other by using anisotropic electrically conducting or optical light-guide adhesives. The bonding is performed by laminating the flexible substrates to each other via the adhesive in a continuous process. Anisotropic conductors conduct in one direction (i.e. top to bottom) but do not conduct sideways.

DETAILED DESCRIPTION OF THE INVENTION

Figure 1:
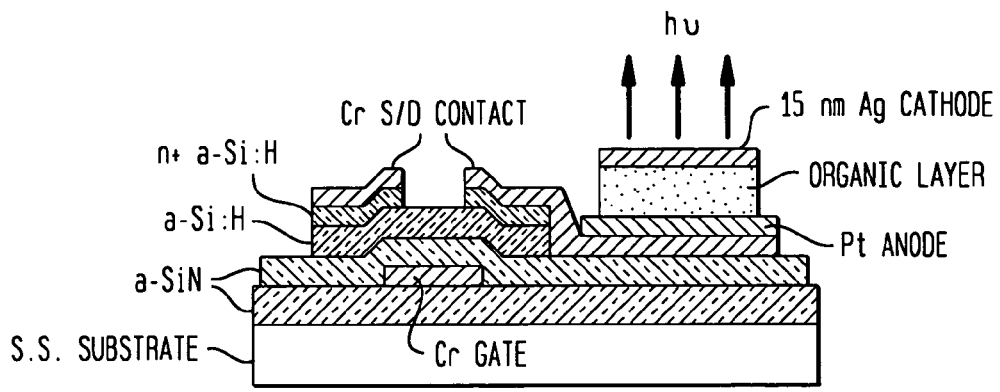
FIG. 1 is a schematic drawing of a pixel for a display of organic light emitting diodes driven by an active matrix of thin film transistors made on a steel back plane.

Many electronic products combine several electronic and/or optical functions. An active-matrix liquid-crystal display is an example of such a product. It consists of a light source, a plane of transistor electronics, a layer of liquid crystal sandwiched between transparent conductors and polarizers, and a plane of color filters. Typically, such products are made by separately manufacturing the individual components, such as the light source, the transistor back plane, and the color filter plane, followed by assembly and filling of the liquid crystal material. The separate manufacture allows the individual optimization of the performance of each component. Often, separate manufacture is necessary to obtain the desired functionality. For example, the transistor back plane of a liquid crystal display could not be manufactured after assembly, because assembly renders the required substrate surface inaccessible. However, it is well known that integration of several functions on one substrate leads to savings in cost, improvement of yield, and increased functionality.

The need for combining several electronic functions at low cost with high yield becomes paramount in the field of macroelectronics, also called large-area electronics or giant electronics. Macroelectronic products are expected to have very low cost per unit area, rather than per function as is the case for conventional microelectronics. This requirement is apparent for typical examples of future macroelectronic products, such as disposable, intelligent shipping/shopping labels, digital wallpaper, and dial-your-pattern dresses. These products may include transistor electronics, input/output devices such as antennae, optoelectronic functions including photodetectors and light-emitting diodes, and microelectromechanical devices.

To keep costs low and achieve high yield, the manufacture of macroelectronic products must combine high-speed production of these functions with their integration at high yield. High-speed production can be achieved by the printing of macroelectronics on flexible substrates. The substrate will spool off a roll, run through equipment that is configured like a multi-color printing press, and then will be coiled up or cut into product. The diversity of macroelectronic component functions (transistors, LEDs, photodetectors, etc.) requires diverse materials and manufacturing processes. Superposing these materials and processes in a fully integrated sequence reduces yield because the temperature and chemicals required for producing a given function may damage a function that was introduced earlier in a lower layer of the multilayer structure.

The present invention maintains high-speed manufacturing while the various component functions are manufactured separately under conditions tailored to optimize component performance and yield. The basic concept is to produce each function or group of functions on a separate flexible substrate, and to bond these flexible substrates to each other by using anisotropic electrically conducting or optical lightguide adhesives. The bonding is performed by laminating the flexible substrates to each other via the adhesive in a continuous process.

FIG. 1 shows a pixel for a display of organic light emitting diodes driven by an active matrix of thin film transistors made on a steel back plane. In such devices, thin film transistors must make good electrical contact to the OLEDs to provide sufficient drive current. This is an active matrix emissive display which consists of a back plane of thin film transistors that drive organic light emitting diodes. Such a pixel is shown in the paper by Wu, et al. *Integration of Organic LEDs and Amorphous TFTs onto Unbreakable Metal Foil Substrates,* published in the Tech. Digest Internat. Electron Devices Meeting, San Francisco, Calif., December 8011, 1996, IEEE, Piscataway, N.J. 1996, Paper 308.1, pp. 957–959.

The display shown in FIG. 1 is manufactured in a sequence of steps that adds the TFT and OLED layers to one substrate. A substrate foil, for example, stainless steel, has patterned TFT circuits added first. The OLED circuits are then placed on the substrate. A transparent encapsulation layer (not shown) is then applied. The top contact to the OLED layer must be transparent to transmit the light, which is emitted from the organic semiconductor. In this structure this contact is made in one of the last processing steps. It was found experimentally that this transparent contact to the OLED functions best when made first, i.e., when the OLED is made on top of it ("*Organic LEDs integrated with a-Si TFTs on lightweight metal substrates*", C. C. Wu, et al., Society for Information Display, Internat. Symp. Digest, Vol. XXVIII, SID, Santa Ana, Calif. 1997, pp. 67–70). However, making the OLEDs first on a transparent substrate, followed by making the TFTs on top of the OLEDs is not possible, because the typical TFT process temperature of 200° to 350° C. will destroy the OLED, which must not be heated much above room temperature.

Figure 2:
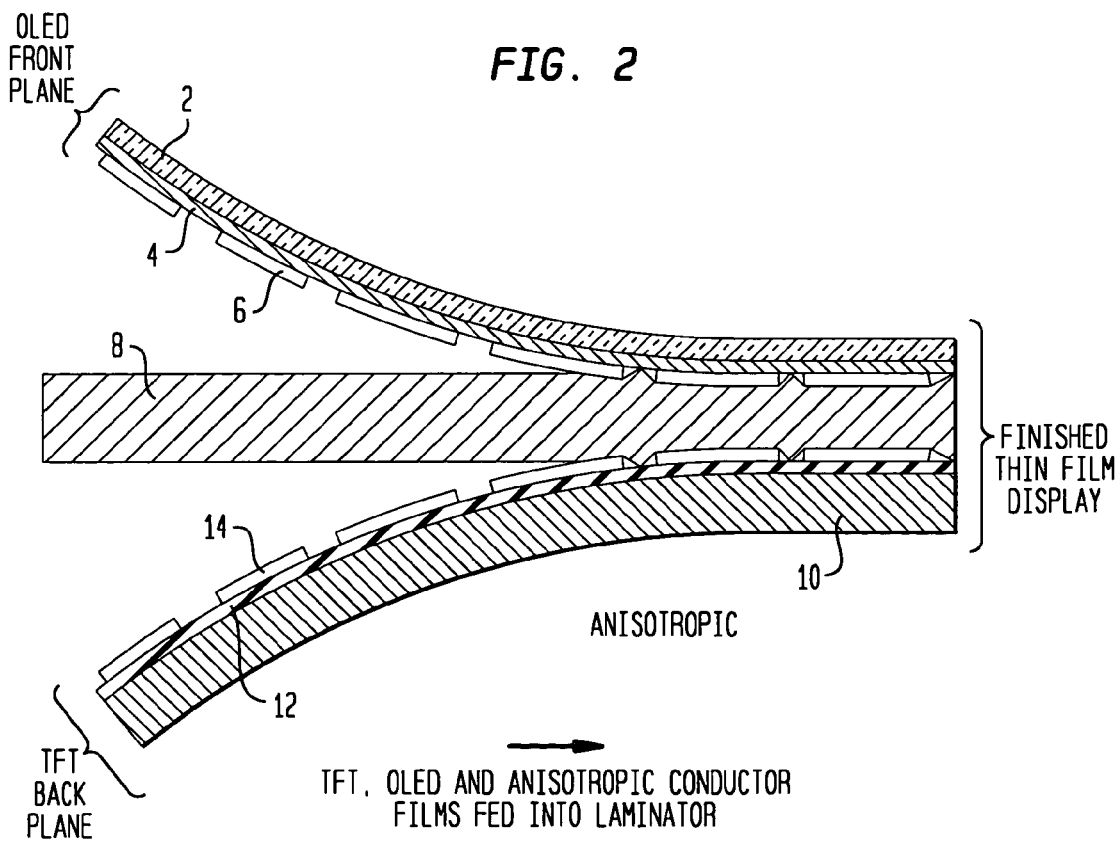
FIG. 2 is a diagram of a co-laminated thin film transistor using anisotropic electrically conducting adhesive.

The present invention addresses this problem by making the TFT back plane and the OLEDs separately, and connecting them electrically with an anisotropic conductor, which conducts only in the direction perpendicular to the layers. This sequence of steps is illustrated in FIG. 2. More particularly, the OLED's 6 are formed on a transparent conductor 4 which is, in turn formed onto a transparent substrate/encapsulation 2. The back plane comprises thin film transistors (TFT's) formed onto structural substrate 10. When the substrate 10 is conducted as is the case for metal foils, an insulated barrier layer 12 must be deposited between the TFT layer and the substrate. The front plane OLED's and the back plane TFT's are connected together with an anistropic conductive adhesive 8. The resultant structure is the finished thin film display.

Nothing is changed in TFT manufacture as compared to the sequence described above. However, the OLEDs are made on a transparent conductor, which in turn is deposited on a transparent substrate. In this way, the best possible electrical contact to the OLEDs is made, and the transparent substrate ultimately serves as the transparent encapsulant. The other electrical contact to the OLEDs may be opaque and is made of a suitable metal. The two planes, TFT and OLED, are then laminated to each other, using an adhesive foil of anisotropic conductor (for example, ARclad® 8257 from Adhesives Research, Inc., a 1-mil thick acrylic product). The final assembly step therefore is the co-lamination of TFT foil, anisotropic conductor foil, and OLED foil.

It is important to note that the proper TFT-OLED connections are made automatically by this procedure, as long as the TFT and OLED planes are aligned with each other.

The same principle can be used to co-laminate component planes with anisotropic light guides, if optical interconnects are desired. The lamination step may be repeated to combine more than two active planes in one product.

Having a body of easily deformable adhesive also provides another advantage in production yield and product lift. The anisotropic conductor will accommodate mechanical strain between the circuit planes that it connects. If a rigid connection were used, any strain developing during fabrication or in produce use will be accommodated by the layer with the lowest elastic modulus. This may be an active layer, for example, the organic light-emitter. Straining this layer may destroy the OLED. Straining the adhesive layer will only lead to local shifts in the contact alignment, which will be self-correcting due to the anisotropic conduction or light guiding.

Anisotropic conductors are used today to make connections between groups of passive conductors on to different planes. One well-known application is the surface-mount of integrated driver circuits to the row and column conductors of liquid crystal displays. The use of a sheet of an anisotropically conducting adhesive for the direct connection of two active circuit planes is new. The problem solved here is coming into being only now, as macroelectronic integrated circuits are developed.

While several advantageous embodiments have been chosen to illustrate the invention, it will be understood by those skilled in the art that various changes and modifications can be made therein without departing from the scope of the invention as defined in the appended claims.

Having thus described the invention in detail, it is to be understood that the foregoing description is not intended to limit the spirit and scope thereof.

What is desired to be protected by Letters Patent is set forth in the appended claims.

1. A thin-film electronic device comprising:
   a first substrate having active electronics formed thereon;
   a second substrate having active electronics formed thereon, the active electronics of the first substrate positioned in facing relation with the active electronics of the second substrate; and
   an anisotropic electrical conductor positioned between the first and second substrates and encapsulating the active electronics.

2. The device of claim 1, wherein at least one of the substrates is flexible.

3. The device of claim 1, wherein both of the substrates are flexible.

4. The device of claim 1, wherein at least one of the substrates comprises flexible foil.

5. The device of claim 1, wherein at least one of the substrates comprises a rigid plate.

6. The device of claim 4, wherein one of the substrates is plastic.

7. The device of claim 5, wherein one of the substrates is plastic.

8. The device of claim 4, wherein one of the substrates is glass.

9. The device of claim 5, wherein one of the substrates is glass.

10. The device of claim 4, wherein one of the substrates is metal.

11. The device of claim 5, wherein one of the substrates is metal.

12. The device of claim 1, further comprising organic light-emitting diodes formed on the first substrate.

13. The device of claim 12, further comprising thin-film transistors formed on the second substrate.

14. The device of claim 1, wherein the active electronics are formed continuously on the first and second substrates.

15. The device of claim 14, wherein the first and second substrates are laminated together.

16. A thin-film electronic device comprising:
   a first substrate having active electronics formed thereon;
   a second substrate having active electronics formed thereon, the active electronics of the first substrate positioned in facing relation with the active electronics of the second substrate; and
   a light guide positioned between the first and second substrates and encapsulating the active electronics.

17. The device of claim 16, wherein at least one of the substrates is flexible.

18. The device of claim 16, wherein both of the substrates are flexible.

19. The device of claim 16, wherein at least one of the substrates comprises flexible foil.

20. The device of claim 16, wherein at least one of the substrates comprises a rigid plate.

21. The device of claim 19, wherein one of the substrates is plastic.

22. The device of claim 20, wherein one of the substrates is plastic.

23. The device of claim 19, wherein one of the substrates is glass.

24. The device of claim 20, wherein one of the substrates is glass.

25. The device of claim 19, wherein one of the substrates is metal.

26. The device of claim 20, wherein one of the substrates is metal.

27. The device of claim 16, further comprising organic light-emitting diodes formed on the first substrate.

28. The device of claim 27, further comprising thin-film transistors formed on the second substrate.

29. The device of claim 16, wherein the active electronics are formed continuously on the first and second substrates.

30. The device of claim 29, wherein the first and second substrates are laminated together.

* * * * *

UNITED STATES PATENT AND TRADEMARK OFFICE
CERTIFICATE OF CORRECTION

| | | |
|---|---|---|
| PATENT NO. | : 7,115,983 B2 | Page 1 of 1 |
| APPLICATION NO. | : 10/945610 | |
| DATED | : October 3, 2006 | |
| INVENTOR(S) | : Sigurd Wagner | |

It is certified that error appears in the above-identified patent and that said Letters Patent is hereby corrected as shown below:

Column 1, after the Related Applications section, please insert the following:

--STATEMENT OF GOVERNMENT RIGHTS

The present invention has been made under a grant of DARPA, federal grant no. F33615-94-1-1464. Accordingly, the government may have certain rights to the present invention,--

Signed and Sealed this

Ninth Day of January, 2007

JON W. DUDAS
*Director of the United States Patent and Trademark Office*